US012804999B2

(12) United States Patent
Basker et al.

(10) Patent No.: US 12,804,999 B2
(45) Date of Patent: Nov. 17, 2026

(54) ISOLATION MODULE FOR BACKSIDE POWER DELIVERY

(71) Applicant: Applied Materials, Inc., Santa Clara, CA (US)

(72) Inventors: Veeraraghavan S. Basker, Schenectady, NY (US); Gregory Costrini, Flanders, NJ (US); Ashish Pal, San Ramon, CA (US); Benjamin Colombeau, Salem, MA (US); Balasubramanian Pranatharthiharan, Santa Clara, CA (US); Prasad Bhosale, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 401 days.

(21) Appl. No.: 18/645,229

(22) Filed: Apr. 24, 2024

(65) Prior Publication Data

US 2025/0338598 A1 Oct. 30, 2025

(51) Int. Cl.
*H10D 84/03* (2025.01)
*H10D 30/01* (2025.01)
(Continued)

(52) U.S. Cl.
CPC ......... *H10D 84/038* (2025.01); *H10D 30/014* (2025.01); *H10D 64/0112* (2026.01); *H10D 84/0149* (2025.01); *H10D 30/43* (2025.01); *H10D 30/6735* (2025.01); *H10D 30/6757* (2025.01); *H10D 62/121* (2025.01); *H10D 64/258* (2025.01)

(58) Field of Classification Search
CPC ............... H10D 84/038; H10D 30/014; H10D 84/0149; H10D 64/0112
See application file for complete search history.

(56) References Cited

U.S. PATENT DOCUMENTS 12,690,445 B2 * 7/2026 Xie ..................... H10W 20/427
2020/0135932 A1 4/2020 Wang et al.
(Continued)

OTHER PUBLICATIONS

International Search Report and Written Opinion dated Jul. 10, 2025 for Application No. PCT/US2025/021479.

*Primary Examiner* — Michael Jung
(74) *Attorney, Agent, or Firm* — Patterson + Sheridan, LLP

(57) ABSTRACT

A method of forming a portion of a gate-all-around field-effect transistor (GAA FET) includes forming placeholders, each interfacing with an extension region electrically isolated from replacement-metal-gate (RMG) stacks by inner spacers, in recesses formed within portions of a substrate isolated by shallow trench isolations (STIs), the recesses extending into a front inter-layer dielectric (ILD) formed on the substrate, removing the placeholders selectively to the substrate and the STIs, forming a cavity at an exposed surface of the extension region within each of the recesses, forming a contact layer within the cavity, forming an interface on the contact layer, and a contact metallization process to form a metal contact within each of the recesses, selectively etching the substrate against the RMG stacks and form ILD recesses between adjacent metal contacts, forming a dielectric liner surrounding the metal contacts, and forming a back ILD in each of the ILD recesses.

20 Claims, 9 Drawing Sheets

(51) Int. Cl.

| | |
|---|---|
| ***H10D 64/01*** | (2025.01) |
| ***H10D 84/01*** | (2026.01) |
| *H10D 30/43* | (2025.01) |
| *H10D 30/67* | (2025.01) |
| *H10D 62/10* | (2025.01) |
| *H10D 64/23* | (2025.01) |

(56) References Cited

U.S. PATENT DOCUMENTS

| | | | | |
|---|---|---|---|---|
| 2022/0238660 | A1* | 7/2022 | Huang | H10D 30/014 |
| 2022/0271139 | A1* | 8/2022 | Su | H10D 30/6735 |
| 2022/0406664 | A1* | 12/2022 | Xie | H10D 30/014 |
| 2023/0068854 | A1 | 3/2023 | Fulford et al. | |
| 2023/0122723 | A1 | 4/2023 | Weeks et al. | |
| 2023/0170352 | A1 | 6/2023 | Bao et al. | |
| 2023/0170400 | A1 | 6/2023 | Pal et al. | |
| 2024/0006482 | A1* | 1/2024 | Yu | H10D 30/014 |
| 2024/0290850 | A1* | 8/2024 | Fan | H10D 30/014 |
| 2024/0379438 | A1 | 11/2024 | Basker et al. | |
| 2025/0040170 | A1 | 1/2025 | Basker et al. | |

* cited by examiner

ISOLATION MODULE FOR BACKSIDE POWER DELIVERY

BACKGROUND

Field

Embodiments described herein generally relate to semiconductor device fabrication, and more particularly, to forming an isolation module for backside power delivery.

Description of the Related Art

Traditionally, chips are constructed with transistors on a front side of a silicon wafer and all interconnects that power them and transmit their data signals built above them. One of the key technologies to enable scaling below 3 nm involves delivering of power on a back side of a chip. This backside power delivery eliminates the need to share interconnect resources between signals and power lines on a front side of the chip as power is moved to the back side of the chip. Backside power delivery further eliminates the need for a power delivery track from lower layer front side interconnects, leading to cost savings. Backside power delivery also allows different metal layers to be optimally fabricated, such as wider lines for an operating voltage Vad and a common ground voltage $V_{ss}$, and thinner lines to carry signals.

However, backside power delivery creates new challenges, such as patterning electrical contact features isolated from one another by isolation modules on a backside of a chip within tight spaces without impacting performance of transistors on a front side of the chip.

Therefore, there is a need for methods for overcoming such challenges in backside power delivery.

SUMMARY

Embodiments of the present disclosure provide a method of forming a portion of a gate-all-around field-effect transistor (GAA FET). The method includes performing a placeholder forming process to form placeholders, each interfacing with an extension region electrically isolated from replacement-metal-gate (RMG) stacks by inner spacers, in recesses formed within portions of a substrate isolated by shallow trench isolations (STIs), the recesses extending into a front inter-layer dielectric (ILD) formed on the substrate, performing a placeholder removal process to remove the placeholders selectively to the substrate and the STIs, performing a cavity shaping process to form a cavity at an exposed surface of the extension region within each of the recesses, and a contact formation process to form a contact layer within the cavity, performing a silicide formation process to form an interface on the contact layer, and a contact metallization process to form a metal contact within each of the recesses, performing a substrate removal process to selectively etch the substrate against the RMG stacks and form ILD recesses between adjacent metal contacts, performing a liner deposition process to form a dielectric liner surrounding the metal contacts, and performing an oxide fill process to form a back ILD in each of the ILD recesses.

Embodiments of the present disclosure also provide a method of forming a portion of a gate-all-around field-effect transistor (GAA FET). The method includes performing a placeholder forming process to form placeholders, each interfacing with an extension region electrically isolated from replacement-metal-gate (RMG) stacks by inner spacers, in recesses formed within portions of a substrate isolated by shallow trench isolations (STIs), the recesses extending into a front inter-layer dielectric (ILD) formed on the substrate, performing a placeholder removal process to remove the placeholders selectively to the substrate and the STIs, performing a substrate nitridation process to form nitride layers on inner surfaces of the recesses, performing a cavity shaping process to form a cavity at an exposed surface of the extension region within each of the recesses, and a contact formation process to form a contact layer within the cavity, performing a silicide formation process to form an interface on the contact layer, and a contact metallization process to form a metal contact within each of the recesses, performing a substrate removal process to selectively etch the substrate against the RMG stacks and form ILD recesses between adjacent metal contacts, performing a liner deposition process to form a dielectric liner surrounding the metal contacts, and performing an oxide fill process to form a back ILD in each of the ILD recesses.

Embodiments of the present disclosure further provide a method of forming a portion of a gate-all-around field-effect transistor (GAA FET). The method includes performing a placeholder removal process to remove placeholders formed in recesses within portions of a substrate isolated by shallow trench isolations (STIs), selectively to the substrate and the STIs, wherein each of the placeholders interfaces with an extension region electrically isolated from replacement-metal-gate (RMG) stacks by inner spacers, and the recesses extending into a front inter-layer dielectric (ILD) formed on the substrate, performing a contact formation process to form a contact layer on an exposed surface of the extension region within each of the recesses, performing a silicide formation process to form an interface on the contact layer, and a contact metallization process to form a metal contact within each of the recesses, performing a substrate removal process to selectively etch the substrate against the RMG stacks and form ILD recesses between adjacent metal contacts, performing a liner deposition process to form a dielectric liner surrounding the metal contacts, and performing an oxide fill process to form a back ILD in each of the ILD recesses.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of the scope of the disclosure, as the disclosure may admit to other equally effective embodiments.

Figure 1:
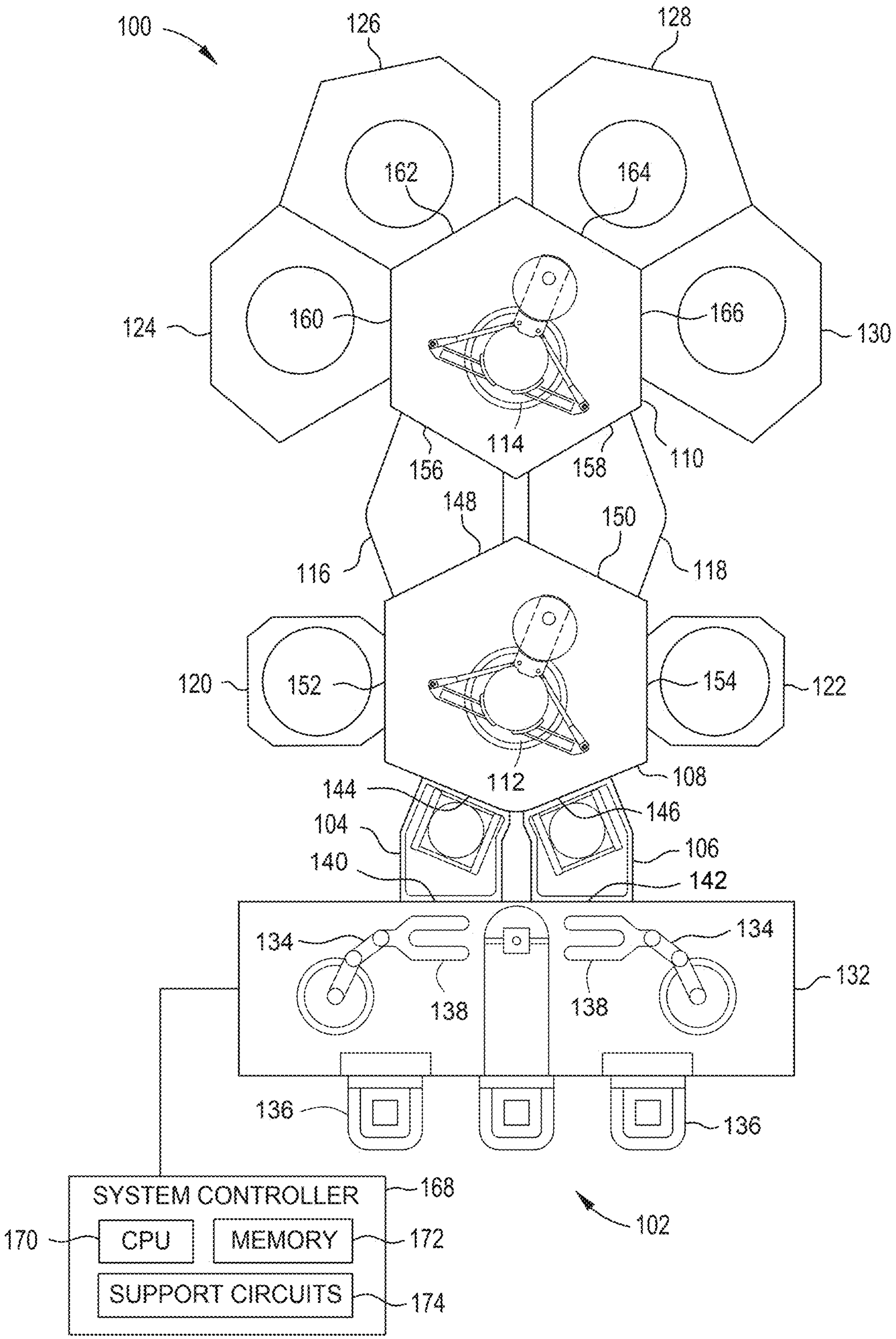
FIG. 1 is a schematic top view of a multi-chamber processing system, according to one or more embodiments of the present disclosure.

To facilitate understanding, identical reference numerals have been used, where possible, to designate identical elements that are common to the figures. It is contemplated that elements and features of one embodiment may be beneficially incorporated in other embodiments without further recitation. In the figures and the following description, an orthogonal coordinate system including an X-axis, a Y-axis, and a Z-axis is used. The directions represented by the arrows in the drawings are assumed to be positive directions for convenience. It is contemplated that elements disclosed in some embodiments may be beneficially utilized on other implementations without specific recitation.

DETAILED DESCRIPTION

The embodiments described herein provide methods for forming metal contacts isolated from one another by an inter-layer dielectric (ILD), by replacing portions of a chip with dielectric material, from a backside of the chip, while protecting source/drain (S/D) epitaxial (epi) layers on a front side of the chip. The methods described herein form isolation (e.g., inter-layer dielectric (ILD)) at the end of the process flow, such that portions of a chip (e.g., silicon (Si)) can be etched highly selectively to underlying gate metals and high-k materials.

FIG. 1 is a schematic top view of a multi-chamber processing system 100, according to one or more embodiments of the present disclosure. The processing system 100 generally includes a factory interface 102, load lock chambers 104, 106, transfer chambers 108, 110 with respective transfer robots 112, 114, holding chambers 116, 118, and processing chambers 120, 122, 124, 126, 128, 130. As detailed herein, substrates in the processing system 100 can be processed in and transferred between the various chambers without exposing the substrates to an ambient environment exterior to the processing system 100 (e.g., an atmospheric ambient environment such as may be present in a fab). For example, the substrates can be processed in and transferred between the various chambers maintained at a low pressure (e.g., less than or equal to about 300 Torr) or vacuum environment without breaking the low pressure or vacuum environment among various processes performed on the substrates in the processing system 100. Accordingly, the processing system 100 may provide for an integrated solution for some processing of substrates.

Examples of a processing system that may be suitably modified in accordance with the teachings provided herein include the Endura®, Producer® or Centura® integrated processing systems or other suitable processing systems commercially available from Applied Materials, Inc., located in Santa Clara, California. It is contemplated that other processing systems (including those from other manufacturers) may be adapted to benefit from aspects described herein.

In the illustrated example of FIG. 1, the factory interface 102 includes a docking station 132 and factory interface robots 134 to facilitate transfer of substrates. The docking station 132 is adapted to accept one or more front opening unified pods (FOUPs) 136. In some examples, each factory interface robot 134 generally includes a blade 138 disposed on one end of the respective factory interface robot 134 adapted to transfer the substrates from the factory interface 102 to the load lock chambers 104, 106.

The load lock chambers 104, 106 have respective ports 140, 142 coupled to the factory interface 102 and respective ports 144, 146 coupled to the transfer chamber 108. The transfer chamber 108 further has respective ports 148, 150 coupled to the holding chambers 116, 118 and respective ports 152, 154 coupled to processing chambers 120, 122. Similarly, the transfer chamber 110 has respective ports 156, 158 coupled to the holding chambers 116, 118 and respective ports 160, 162, 164, 166 coupled to processing chambers 124, 126, 128, 130. The ports 144, 146, 148, 150, 152, 154, 156, 158, 160, 162, 164, 166 can be, for example, slit valve openings with slit valves for passing substrates therethrough by the transfer robots 112, 114 and for providing a seal between respective chambers to prevent a gas from passing between the respective chambers. Generally, any port is open for transferring a substrate therethrough. Otherwise, the port is closed.

The load lock chambers 104, 106, transfer chambers 108, 110, holding chambers 116, 118, and processing chambers 120, 122, 124, 126, 128, 130 may be fluidly coupled to a gas and pressure control system (not specifically illustrated). The gas and pressure control system can include one or more gas pumps (e.g., turbo pumps, cryo-pumps, roughing pumps), gas sources, various valves, and conduits fluidly coupled to the various chambers. In operation, a factory interface robot 134 transfers a substrate from a FOUP 136 through a port 140 or 142 to a load lock chamber 104 or 106. The gas and pressure control system then pumps down the load lock chamber 104 or 106. The gas and pressure control system further maintains the transfer chambers 108, 110 and holding chambers 116, 118 with an interior low pressure or vacuum environment (which may include an inert gas). Hence, the pumping down of the load lock chamber 104 or 106 facilitates passing the substrate between, for example, the atmospheric environment of the factory interface 102 and the low pressure or vacuum environment of the transfer chamber 108.

With the substrate in the load lock chamber 104 or 106 that has been pumped down, the transfer robot 112 transfers the substrate from the load lock chamber 104 or 106 into the transfer chamber 108 through the port 144 or 146. The transfer robot 112 is then capable of transferring the substrate to and/or between any of the processing chambers 120, 122 through the respective ports 152, 154 for processing and the holding chambers 116, 118 through the respective ports 148, 150 for holding to await further transfer. Similarly, the transfer robot 114 is capable of accessing the substrate in the holding chamber 116 or 118 through the port 156 or 158 and is capable of transferring the substrate to and/or between any of the processing chambers 124, 126, 128, 130 through the respective ports 160, 162, 164, 166 for processing and the holding chambers 116, 118 through the respective ports 156, 158 for holding to await further transfer. The transfer and holding of the substrate within and among the various chambers can be in the low pressure or vacuum environment provided by the gas and pressure control system.

The processing chambers 120, 122, 124, 126, 128, 130 can be any appropriate chamber for processing a substrate. In some examples, the processing chamber 120 can be capable of performing etch processes, the processing chamber 122 can be capable of performing cleaning processes, the processing chamber 124 can be capable of performing selective removal processes, the processing chamber 126 can be capable of performing chemical vapor deposition (CVD) deposition processes, and the processing chambers 128, 130 can be capable of performing respective epitaxial growth processes. The processing chamber 120 may be a Selectra™ Etch chamber available from Applied Materials of Santa Clara, Calif. The processing chamber 122 may be a SiCoNi™ Pre-clean chamber available from Applied Materials of Santa Clara, Calif. The processing chamber 126 may be a W×Z™ chamber available from Applied Materials of Santa Clara, Calif. The processing chamber 128, or 130 may be a Centura™ Epi chamber available from Applied Materials of Santa Clara, Calif.

A system controller 168 is coupled to the processing system 100 for controlling the processing system 100 or components thereof. For example, the system controller 168 may control the operation of the processing system 100 using a direct control of the chambers 104, 106, 108, 110, 116, 118, 120, 122, 124, 126, 128, 130 of the processing system 100 or by controlling controllers associated with the chambers 104, 106, 108, 110, 116, 118, 120, 122, 124, 126, 128, 130. In operation, the system controller 168 enables data collection and feedback from the respective chambers to coordinate performance of the processing system 100.

The system controller 168 generally includes a central processing unit (CPU) 170, memory 172, and support circuits 174. The CPU 170 may be one of any form of a general purpose processor that can be used in an industrial setting. The memory 172, or non-transitory computer-readable medium, is accessible by the CPU 170 and may be one or more of memory such as random access memory (RAM), read only memory (ROM), floppy disk, hard disk, or any other form of digital storage, local or remote. The support circuits 174 are coupled to the CPU 170 and may comprise cache, clock circuits, input/output subsystems, power supplies, and the like. The various methods disclosed herein may generally be implemented under the control of the CPU 170 by the CPU 170 executing computer instruction code stored in the memory 172 (or in memory of a particular processing chamber) as, for example, a software routine. When the computer instruction code is executed by the CPU 170, the CPU 170 controls the chambers to perform processes in accordance with the various methods.

Other processing systems can be in other configurations. For example, more or fewer processing chambers may be coupled to a transfer apparatus. In the illustrated example, the transfer apparatus includes the transfer chambers 108, 110 and the holding chambers 116, 118. In other examples, more or fewer transfer chambers (e.g., one transfer chamber) and/or more or fewer holding chambers (e.g., no holding chambers) may be implemented as a transfer apparatus in a processing system.

Figure 2:
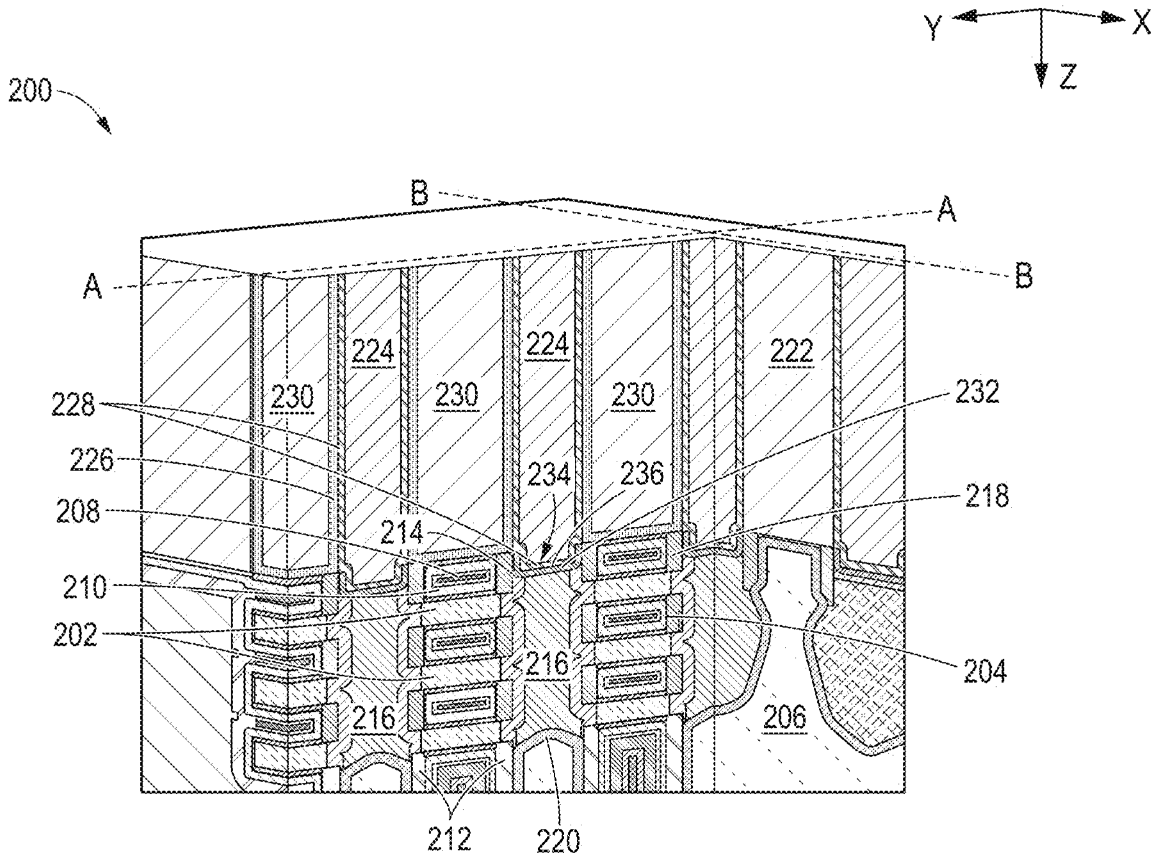
FIG. 2 is an isometric view of a portion of a semiconductor structure that may form a gate-all-around field-effect transistor (GAA FET), according to one or more embodiments of the present structure.

FIG. 2 is an isometric view of a portion of a semiconductor structure 200 that may form a gate-all-around field-effect transistor (GAA FET), according to one or more embodiments of the present structure. In FIG. 2, a cut-out of the semiconductor structure 200 along the YZ plane including the line A-A, and a cut-out of the semiconductor structure 200 along the ZX plane including the line B-B are shown. The semiconductor structure 200 is formed on a substrate and a back side of the semiconductor structure 200 is shown upwards in FIG. 2.

The term "substrate" as used herein refers to a layer of material that serves as a basis for subsequent processing operations and includes a surface to be cleaned. The substrate may be a silicon based material or any suitable insulating materials or conductive materials as needed. The substrate may include a material such as crystalline silicon (e.g., Si<100>, Si<110>, or Si<111>), silicon oxide, strained silicon, silicon germanium, doped or undoped polycrystalline silicon, doped or undoped silicon wafers and patterned or non-patterned wafers, silicon on insulator (SOI), carbon doped silicon oxides, silicon nitride, doped silicon, germanium, gallium arsenide, glass, or sapphire.

As shown in FIG. 2, the semiconductor structure 200 includes channel layers 202 and replacement-metal-gate (RMG) stacks 204, extending in the Y direction, embedded within a front inter-layer dielectric (ILD) 206. Each of the RMG stacks 204 includes a gate metal 208 and a high-k material 210.

The channel layers 202 may be formed of silicon (Si), germanium (Ge), silicon germanium (SiGe), or indium gallium zinc oxide (IGZO). The front ILD 206 may be formed of silicon oxide ($SiO_2$), silicon oxynitride (SiON), silicon oxy-carbon-nitride (SiOCN), aluminum oxide ($Al_2O_3$), or any combination thereof. The gate metal 208 may be formed of titanium nitride (TiN), titanium aluminum carbide (TiAlC), or tungsten (W), or may contain other materials such as lanthanum (La), or aluminum (Al). The high-k material 210 may be formed of hafnium oxides ($HfO_2$), hafnium zirconium oxide ($HfZrO_2$), and aluminum oxide ($Al_2O_3$).

Surfaces of the RMG stacks 204 may be covered by spacers 212. The spacers 212 may be formed of dielectric material, such as silicon oxide ($SiO_2$), silicon oxy-carbide (SiOC), silicon oxy-carbon-nitride (SiOCN), silicon boron carbon nitride (SiBCN), or silicon nitride ($Si_3N_4$), with a thickness of between about 2 nm and about 8 nm.

The semiconductor structure 200 further includes an extension region 214 and an S/D epitaxial (epi) layer 216, via which the channel layers 202 are electrically connected to a source/drain (S/D) contact (not shown). The extension regions 214 are electrically isolated from the RMG stacks 204 by inner spacers 218 disposed on both sides of the RMG stacks 204 in the X direction. The S/D epi layer 216 is interfaced with the front ILD 206 via a contact etch stop layer (CESL) 220.

The extension region 214 may be formed of silicon germanium (SiGe) with a ratio of germanium (Ge) ranging between 0% and 15%, for example, about 10%, lightly doped with p-type dopants such as boron (B) or gallium (Ga), or n-type dopants such as phosphorus (P), arsenic (As), or antimony (Sb), with a concentration of between about $1\times10^{18}$ $cm^{-3}$ and $5\times10^{21}$ $cm^{-3}$, depending upon the desired conductive characteristic of the extension regions 214.

The S/D epi layer 216 may be formed of epitaxially grown silicon (Si) or silicon germanium (SiGe) with a ratio of germanium (Ge) ranging between 10% and 65%, doped with p-type dopants such as boron (B) or gallium (Ga), or n-type dopants such as phosphorus (P), arsenic (As), or antimony (Sb), with a concentration of between about $10^{19}$ $cm^{-3}$ and $5\cdot10^{21}$ $cm^{-3}$, depending upon the desired conductive characteristic of the S/D epi layer 216.

The inner spacers 218 may be formed of dielectric material, such as silicon nitride ($Si_3N_4$) silicon boron carbon nitride (SiBCN), silicon oxy-carbon-nitride (SiOCN), silicon oxycarbide (SiOC), organosilicate glass (SiCOH), or any combination thereof, having a thickness of between about 2 nm and about 8 nm.

The semiconductor structure 200 further includes shallow trench isolations (STIs) 222 formed within the substrate. The STIs 222 may be formed of silicon oxide ($SiO_2$) or other dielectrics such as silicon nitride ($Si_3N_4$) silicon boron carbon nitride (SiBCN), silicon oxy-carbon-nitride (SiOCN), silicon oxycarbide (SiOC), organosilicate glass (SiCOH), or any combination thereof. The S/D epi layers 216 are electrically connected to metal contacts 224, extending in the Z direction, formed between the STIs 222. The metal contacts 224 are each connectable to a voltage source (not shown). The metal contacts 224 may be each surrounded by a dielectric liner 226 and a barrier layer 228. The metal contacts 224 on both sides of the channel layers 202 are isolated by a back ILD 230.

The metal contacts 224 may each have critical dimensions of about 10 nm and about 40 nm in the XY plane and spaced from one another by about 20 nm and about 50 nm. The metal contacts 224 may have a depth in the Z direction of between about 10 nm and 100 nm. The metal contacts 224 may be formed of tungsten (W), ruthenium (Ru), molybdenum (Mo), copper (Cu), cobalt (Co), titanium (Ti), nickel (Ni), silver (Ag), gold (Au), iridium (Ir), tantalum (Ta), platinum (Pt), conductive oxides or nitrides thereof, or any combination thereof. The dielectric liner 226 may be formed of silicon nitride ($Si_3N_4$), silicon oxide ($SiO_2$), silicon oxynitride (SiON), aluminum oxide ($Al_2O_3$), silicon oxy-carbon-nitride (SiOCN), or any combination thereof, having a thickness of between about 1 nm and about 10 nm, for example, about 4 nm. The barrier layer 228 may be formed of titanium nitride (TiN), tantalum nitride (TaN), titanium aluminum carbide (TiAlC), tungsten nitride (WN), or tungsten (W).

The back ILD 230 may be formed of silicon oxide ($SiO_2$), silicon oxynitride (SiON), aluminum oxide ($Al_2O_3$), silicon oxy-carbon-nitride (SiOCN), or any combination thereof.

The semiconductor structure 200 further includes a contact layer 232 within a cavity 234 formed on a surface of the extension region 214, as an interface between the S/D epi layer 216 and the metal contact 224 via an interface 236, to minimize parasitic resistance.

The contact layer 232 may be formed of epitaxially grown silicon germanium (SiGe) with a ratio of germanium (Ge) ranging between 15% and 50%, doped with p-type dopants such as boron (B) or gallium (Ga), with a concentration of between about $1\times10^{18}$ $cm^{-3}$ and $5\times10^{21}$ $cm^{-3}$, or epitaxially grown silicon (Si), doped with n-type dopants, such as phosphorus (P), arsenic (As), or antimony (Sb), with a concentration of between about $1\times10^{18}$ $cm^{-3}$ and $5\times\cdot10^{21}$ $cm^{-3}$. The cavity 234 may have a V-shape, a U-shape, or any other shape, and enlarge a contact area of the metal contact 224, to minimize parasitic resistance. The interfaces 236 may be formed of metal silicide, such as titanium silicide (TiSi, $TiSi_2$), nickel silicide (NiSi, $Ni_2Si$), molybdenum silicide (MoSi, $MoSi_2$), cobalt silicide ($CoSi_2$), tantalum silicide ($TaSi_2$), or any combination thereof.

Figure 3:
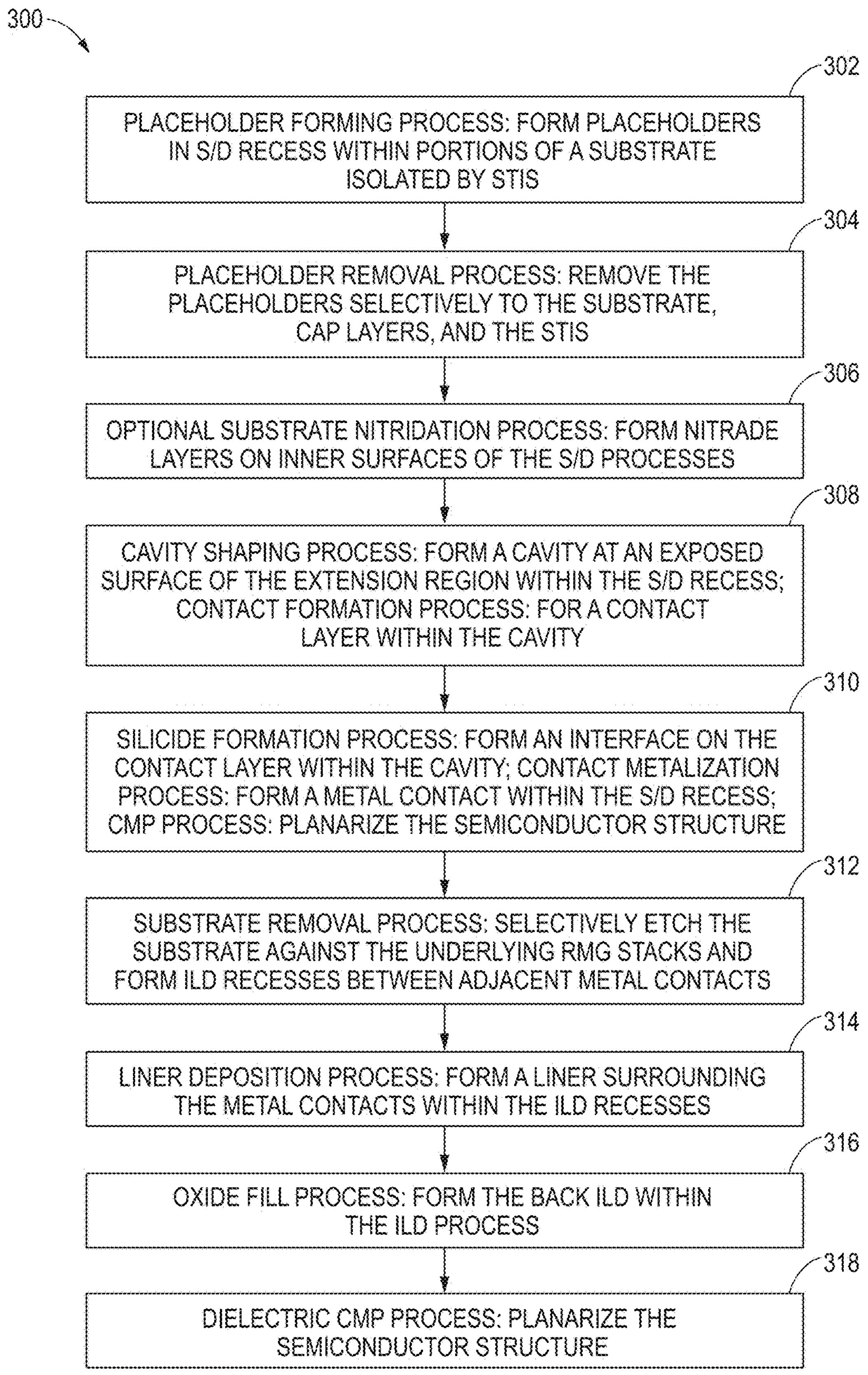
FIG. 3 depicts a process flow diagram of a method of forming cell transistors in a semiconductor structure according to one embodiment.
Figure 4A:
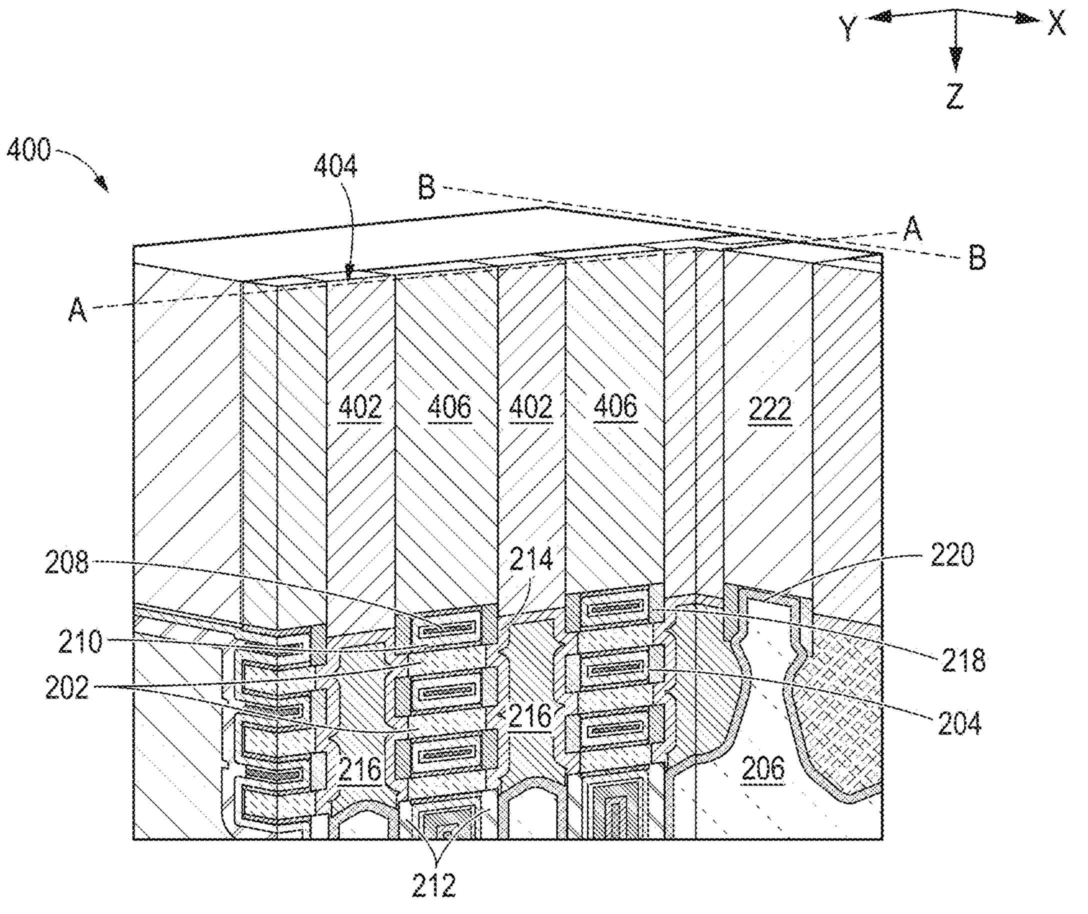
FIGS. 4A, 4B, 4B', 40, 4C', 4D, 4D', 4E, 4E', 4F, and 4G are isometric views of a portion of a semiconductor structure corresponding to various states of the method of FIG. 3.
Figure 4B:
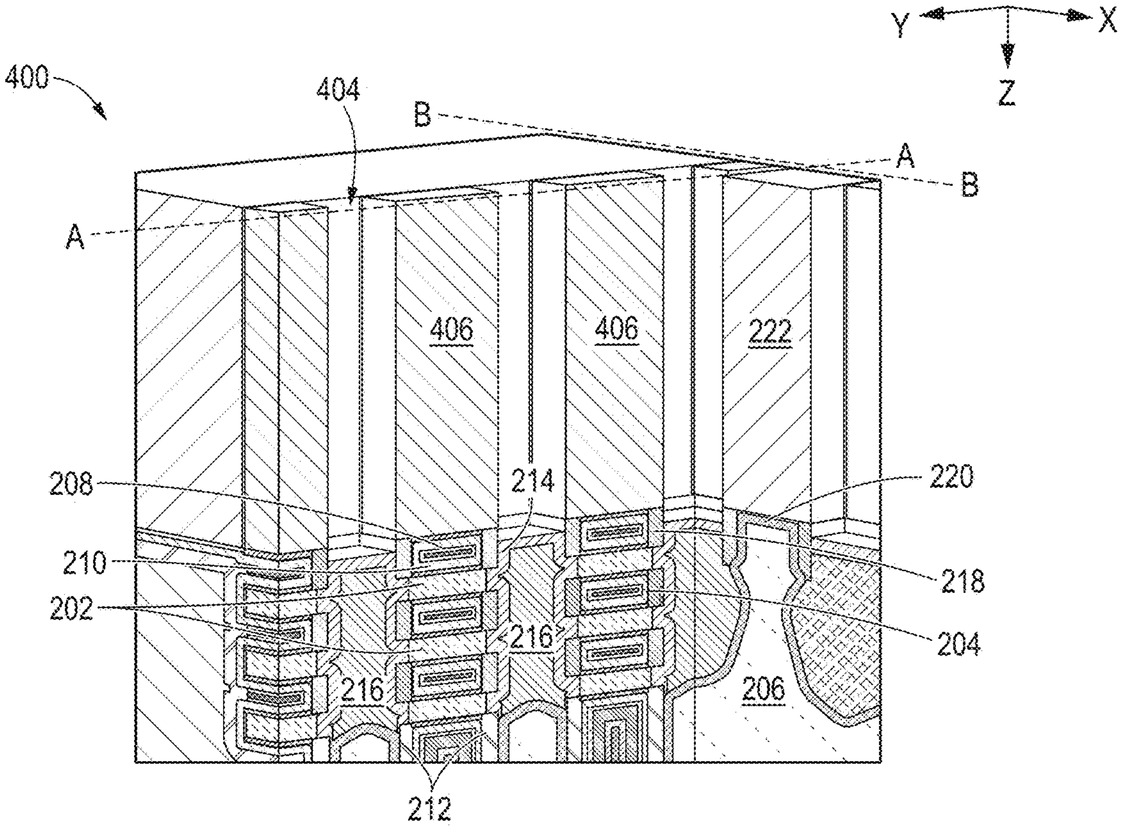
Figure 4B:
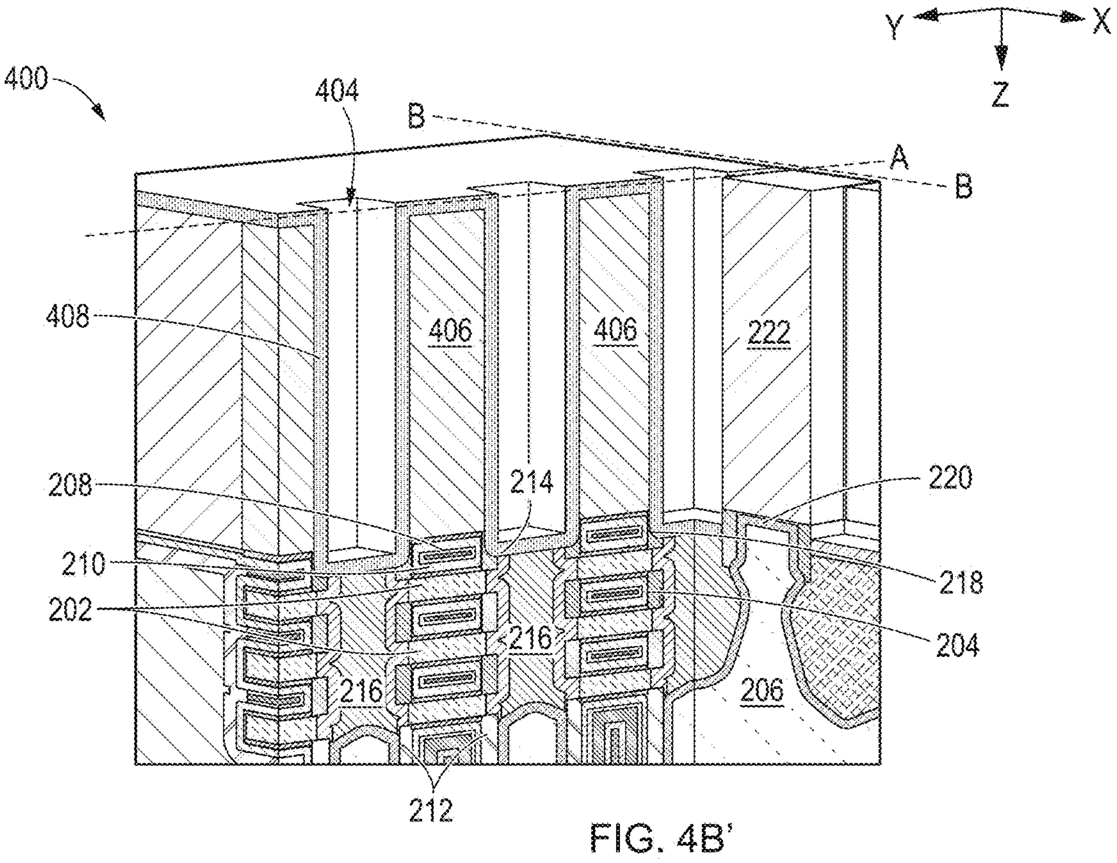

FIG. 3 depicts a process flow diagram of a method 300 of forming a semiconductor structure 400 that may be the semiconductor structure 200 forming a portion of a gate-all-around field-effect transistor (GAA FET), according to one or more embodiments of the present disclosure. FIGS. 4A, 4B, 4B', 4C, 4C', 4D, 4D', 4E, 4E', 4F, and 4G are isometric views of a portion of the semiconductor structure 400, with a cut-out of the semiconductor structure 400 along the YZ plane including the line A-A and a cut-out of the semiconductor structure 400 along the ZX plane including the line B-B, corresponding to various states of the method 300. It should be understood that FIGS. 4A, 4B, 4B', 4C, 4C', 4D, 4D', 4E, 4E', 4F, and 4G illustrate only partial schematic views of the semiconductor structure 400, and the semiconductor structure 400 may contain any number of transistor sections and additional materials having aspects as illustrated in the figures. It should also be noted that although the method illustrated in FIG. 3 is described sequentially, other process sequences that include one or more operations that have been omitted and/or added, and/or has been rearranged in another desirable order, fall within the scope of the embodiments of the disclosure provided herein.

The method 300 begins with block 302, in which a placeholder forming process is performed to form placeholders 402 in S/D recesses 404 within portions of a substrate 406 isolated by the STIs 222, as shown in FIG. 4A. The S/D recesses 404 are formed by etching into the front ILD 206 and the substrate 406 from a front side of the semiconductor structure 400 (shown downwards in FIG. 4A), using any appropriate lithography and etch processes, such as photolithography and dry anisotropic etching, performed in a processing chamber, such as the processing chamber 120 shown in FIG. 1. The placeholders 402 are formed in portions of the S/D recesses 404 within the substrate 406, using any appropriate deposition process, such as chemical vapor deposition (CVD), or physical vapor deposition (PVD), performed in a processing chamber, such as the processing chamber 126, 128, or 130 shown in FIG. 1. In the remaining portions of the S/D recesses 404 within the front ILD 206, extension regions 214 and S/D epitaxial (epi) layers 216 are formed on both sides of the channel layers 202. The extension regions 214 are electrically isolated from the RMG stacks 204 by inner spacers 218 disposed on both sides of the RMG stacks 204 in the X direction.

In block 304, a placeholder removal process is performed to remove the placeholders 402 (e.g., silicon germanium (SiGe)) selectively to the substrate 406 (e.g., silicon (Si)) and the STIs 222 (e.g., silicon oxide ($SiO_2$)), as shown in FIG. 4B. The placeholder removal process may include any appropriate dry anisotropic etching or wet etching process, performed in a processing chamber, such as the processing chamber 120 shown in FIG. 1. In some embodiments, the placeholder removal process is a selective etch process to remove the placeholders 402 selectively to the extension regions 214. In some other embodiments, the placeholder removal process is a non-selective etch process to remove the placeholders 402 and a portion of the extension regions 214.

In block 306, an optional substrate nitridation process is performed to form nitride layers 408 on inner surfaces of the S/D recesses 404, as shown in FIG. 4B'. The nitride layers 408 may be formed of silicon nitride ($Si_3N_4$). The optional substrate nitridation process may be a radical or ion-based process of nitrogen (N) plasma into the substrate 406 (e.g., silicon (Si)) whereby they convert silicon (Si) to a silicon nitride ($Si_3N_4$) layer by forming Si—N bonds.

The substrate nitridation process may be a plasma treatment process, such as a decoupled plasma nitridation (DPN) process, a decoupled plasma (DPX) process, a decoupled plasma plus (DPX+) process, or a rapid thermal nitridation (RTN) process performed in a processing chamber, such as a Radiance™ chamber, available from Applied Materials, Inc., Santa Clara, Calif. or the processing chambers 120, 122, 124, 126, 128, and 130 shown in FIG. 1. Gases that may be used in the plasma treatment process include nitrogen containing gas, such as nitrogen ($N_2$), ammonia ($NH_3$), or mixtures thereof.

Figure 4C:
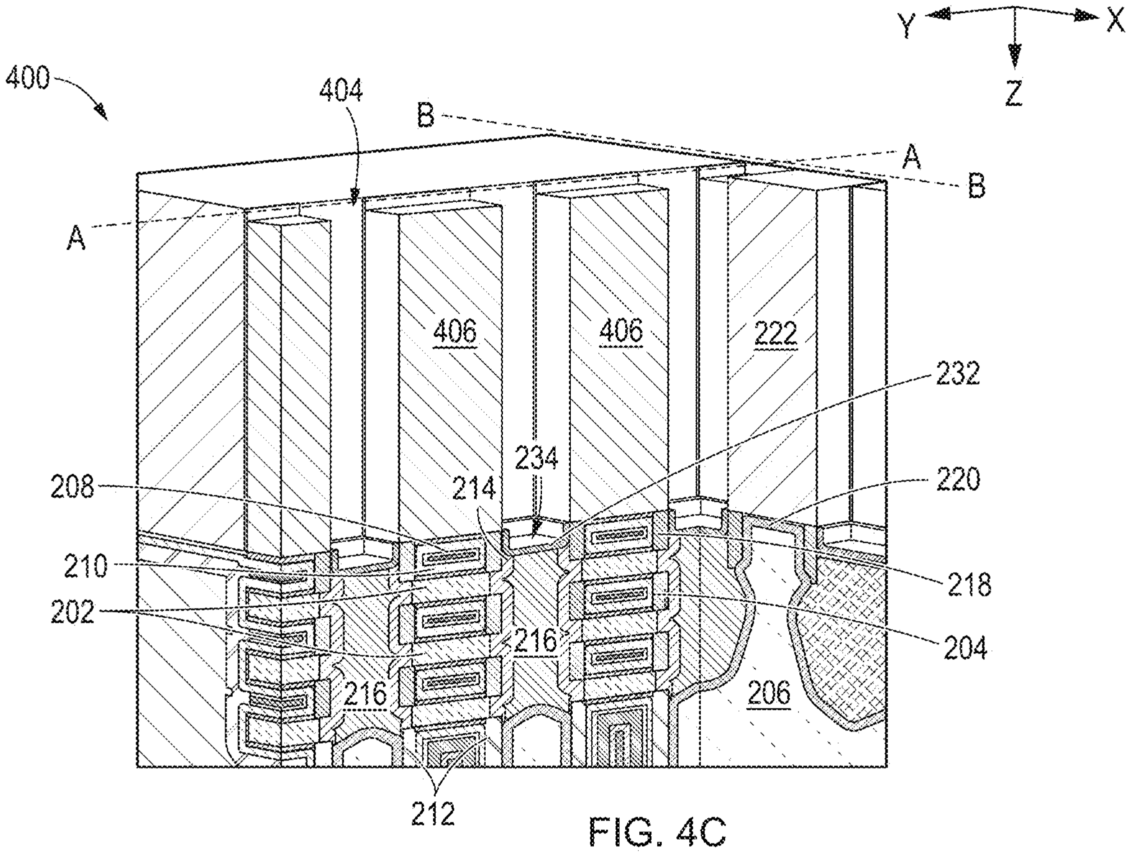
Figure 4C:
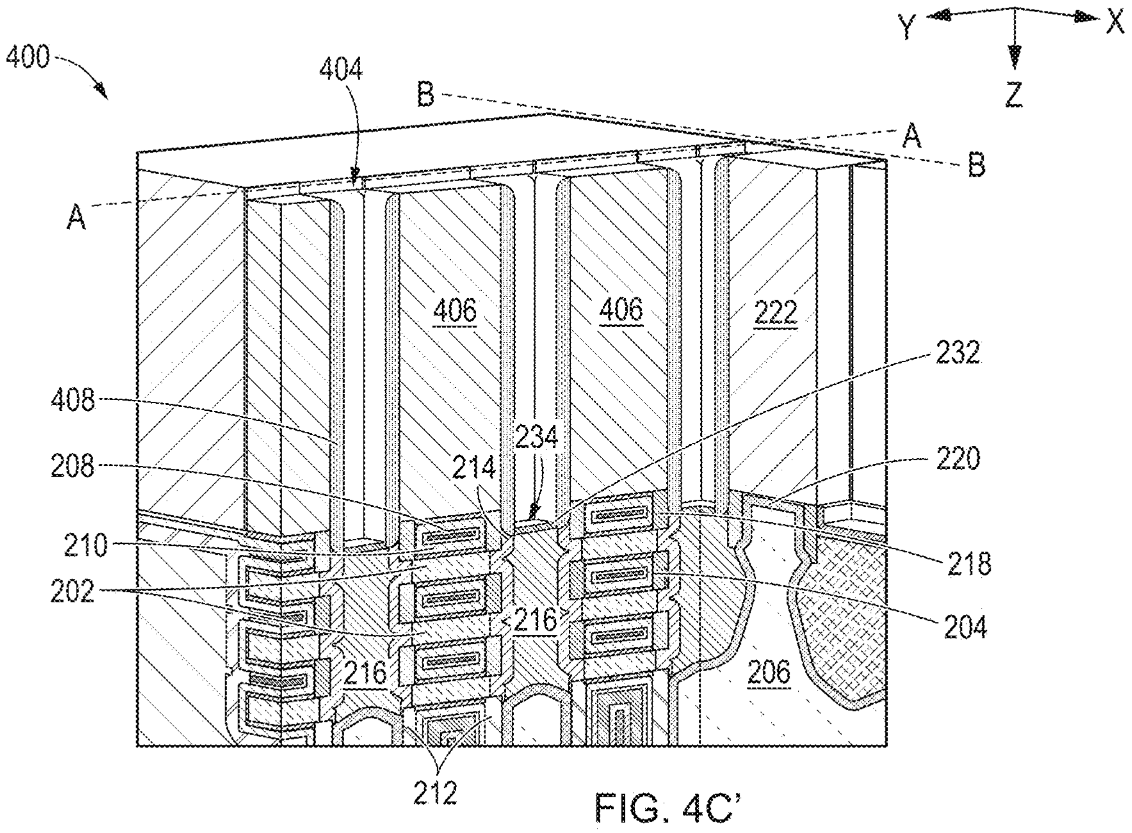

In block 308, a cavity shaping process is performed to form a cavity 234 at an exposed surface of the extension region 214 within the S/D recess 404, and a contact formation process is performed to form a contact layer 232 within the cavity 234, as shown in FIGS. 4C and 4C'.

In FIG. 4C', the nitride layers 408 formed in the optional substrate nitridation process in block 306 are shown. The nitride layers 408 at bottoms of the S/D recesses 404 are removed by the cavity shaping process and the nitride layers 408 on sidewalls of the S/D recesses 404 remain un-etched.

The cavity 234 may have a V-shape, a U-shape, or any other shape, and enlarge a contact area of a metal contact to be formed within the S/D recess 404, to minimize parasitic resistance.

The contact layer 232 is formed as an interface between the S/D epi layer 216 and a metal contact to be formed within the S/D recess 404, to minimize parasitic resistance. The contact layer 232 is formed of silicon germanium (SiGe) with a ratio of germanium (Ge) ranging between 20% and 100%. The contact layer 232 may be formed of epitaxially grown silicon germanium (SiGe) with a ratio of germanium (Ge) ranging between 25% and 50%, doped with p-type dopants such as boron (B) or gallium (Ga), with a concentration of between about $1\times10^{18}$ $cm^{-3}$ and $5\times10^{21}$ $cm^{-3}$, or epitaxially grown silicon (Si), doped with n-type dopants, such as phosphorus (P), arsenic (As), or antimony (Sb), with a concentration of between about $1\times10^{18}$ $cm^{-3}$ and $5\times10^{21}$ $cm^{-3}$.

The cavity shaping process includes an etch process using an etching gas including halogen-containing gas, such as chlorine ($Cl_2$), hydrogen chloride (HCl), or hydrogen fluoride (HF), carbon-containing fluorine (F) chemistries, such as tetrafluoromethane ($CF_4$), trifluoromethane ($CHF_3$), difluoromethane ($CH_2F_2$), or fluoromethane ($CH_3F$), bromine-containing chemistries such as HBr, and carrier gas, such as argon (Ar), or helium (He), performed in an etch chamber, such as the processing chamber 120 shown in FIG. 1.

The contact formation process may be a selective epitaxial deposition process that includes an epitaxial deposition process and an etch process, performed in a processing chamber, such as the processing chamber 126, 128, or 130 shown in FIG. 1.

The epitaxial deposition process may use a deposition gas including a silicon-containing precursor, a germanium containing precursor, and a dopant source. The silicon-containing precursor may include silane ($SiH_4$), disilane ($Si_2H_6$), tetrasilane ($Si_4H_{10}$), or a combination thereof. The germanium-containing precursor may include germane ($GeH_4$), germanium tetrachloride ($GeCl_4$), and digermane ($Ge_2H_6$). The dopant source may include, for example, boron, or gallium, depending upon the desired conductive characteristic of the contact layer 232. The dopant source may include a precursor diborane ($B_2H_6$).

The etch process may use an etching gas that includes an etchant gas and a carrier gas. The etchant gas may include halogen-containing gas, such as hydrogen chloride (HCl), chlorine ($Cl_2$), or hydrogen fluoride (HF). The carrier gas may include nitrogen ($N_2$), argon (Ar), helium (He), or hydrogen ($H_2$).

The contact formation process may be performed at a low temperature less than about 450° C. and at a pressure of between 5 Torr and 600 Torr. A cycle of the epitaxial deposition and etch processes may be repeated as needed to obtain a desired thickness of the contact layer 232. A thickness of the contact layer 232 may be between about 10 Å and about 100 Å.

Figure 4D:
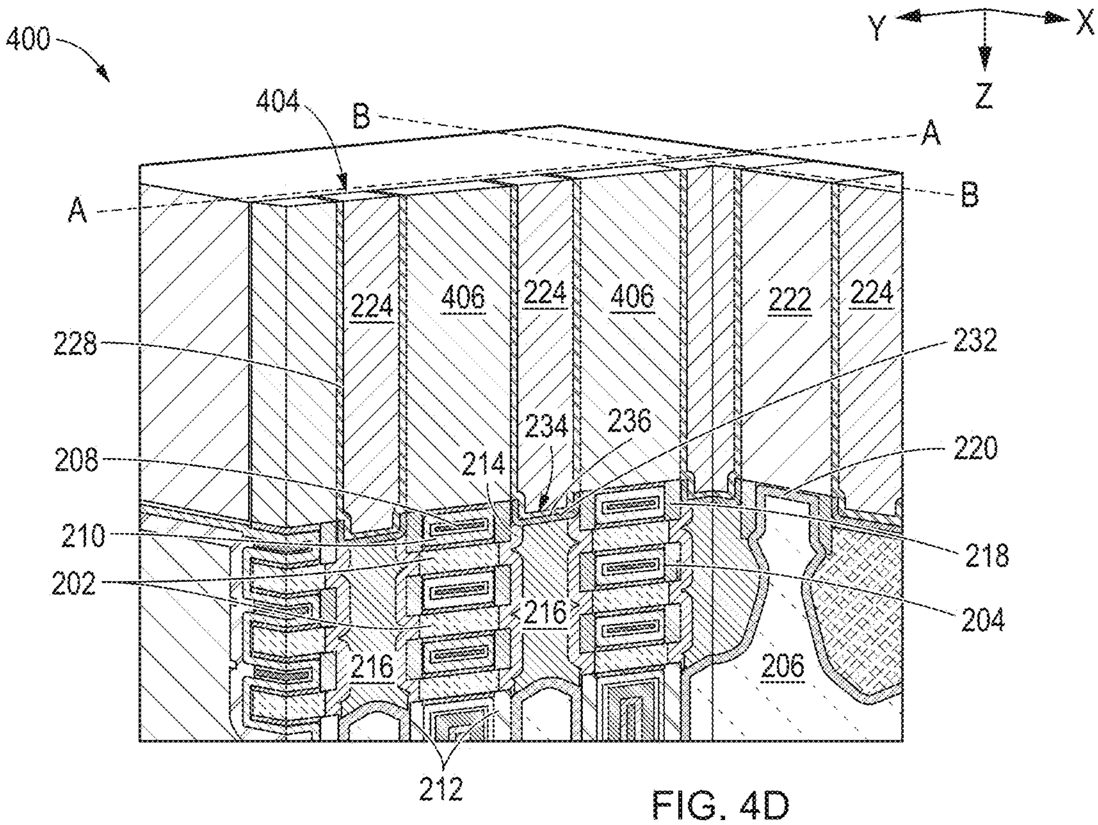
Figure 4D:
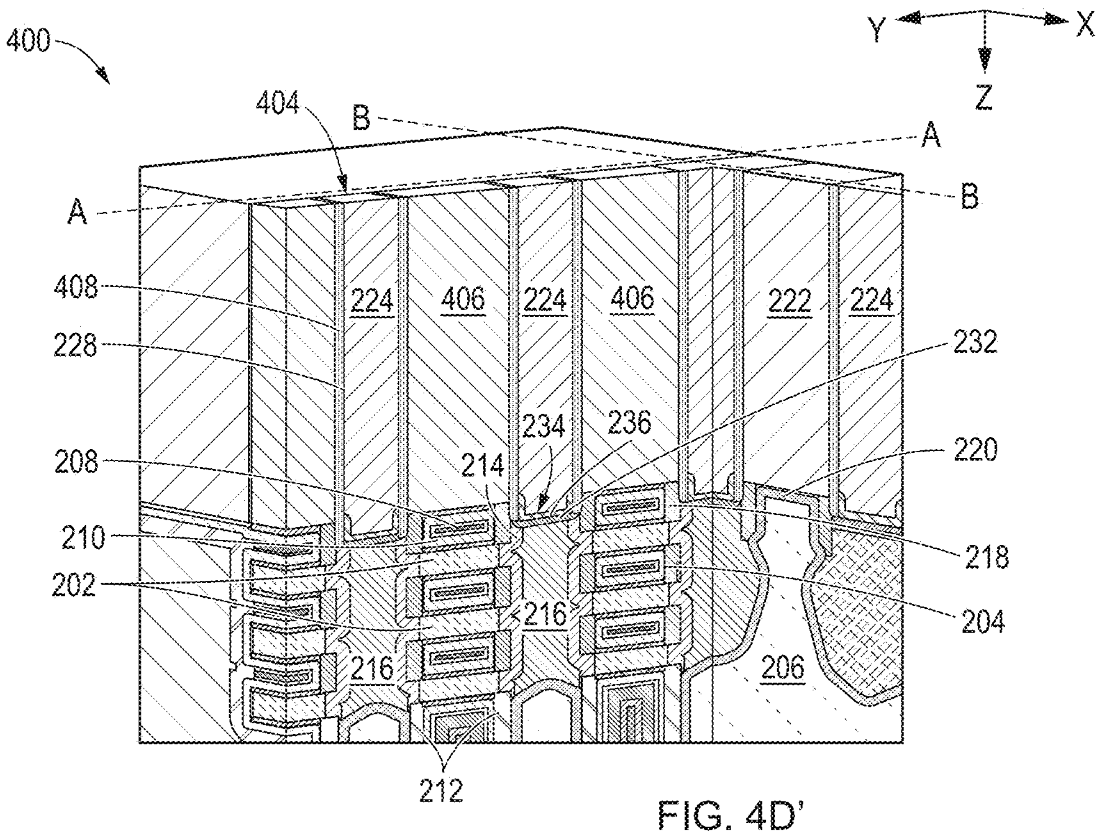

In block 310, a silicide formation process is performed to form an interface 236 on the contact layer 232 within the cavity 234, a contact metallization process is performed to form a metal contact 224 within the S/D recess 404, and a chemical mechanical planarization (CMP) process are performed to planarize the semiconductor structure 400, as shown in FIGS. 4D and 4D'.

In FIG. 4D', the nitride layers 408 formed on the sidewalls of the S/D recesses 404 formed in the optional substrate nitridation process in block 306 are shown.

The interface 236 provides an electrical connection between the contact layer 232 and the metal contact 224. The silicide forming process includes a deposition process, such as chemical vapor deposition (CVD), physical vapor deposition (PVD), or the like performed in a processing chamber, such as the processing chamber 126, 128, or 130 shown in FIG. 1.

In some embodiments, the interface 236 is formed of molybdenum (Mo), ruthenium (Ru), or silicide thereof, on the contact layer 232 of p-type. In the deposition process, a deposition gas including a metal source, such as a molybdenum (Mo)-containing halide precursor, or a ruthenium (Ru)-containing organometallic that includes ruthenium (Ru), is used. The silicide forming process may be performed at a temperature of between about 240° C. and about 450° C. and at a pressure of between 3 Torr and 300 Torr. During the deposition process, argon (Ar) gas may be supplied at a flow rate of between about 0 sccm and about 1000 sccm, and hydrogen ($H_2$) gas may be supplied at a flow rate of between about 500 sccm and about 15000 sccm, for example.

In some embodiments, the interface 236 is formed of a second metal material, such as titanium (Ti), cobalt (Co), nickel (Ni), tantalum (Ta), lanthanum (La), yttrium (Y), hafnium (Hf), zirconium (Zr), or silicide thereof, formed on the contact layer 232 of n-type. In the deposition process, a deposition gas including a metal source, such as a precursor containing titanium (Ti), tantalum (Ta), cobalt (Co), nickel (Ni), or a combination thereof. The deposition process may be performed at a temperature of between about 300° C. and about 800° C. and at a pressure of between 1° Torr and 50° Torr.

A cycle of the silicide forming process may be repeated as needed to obtain a desired thickness of the interface 236, for example, between about 5 times and about 1000 times.

The metal contact 224 may be formed of contact metal material, such as tungsten (W), cobalt (Co), ruthenium (Ru), or molybdenum (Mo). The metal contact 224 may include a metal that has a desirable work function. The contact metallization process may include a chemical vapor deposition (CVD) process using a tungsten-containing precursor, such as $WF_6$, or a cobalt-containing precursor, in a processing chamber, such as the processing chamber 126, 128, or 130 shown in FIG. 1.

After the metal filling process, the semiconductor structure 400 may be planarized, by use of a chemical mechanical planarization (CMP) process.

Figure 4E:
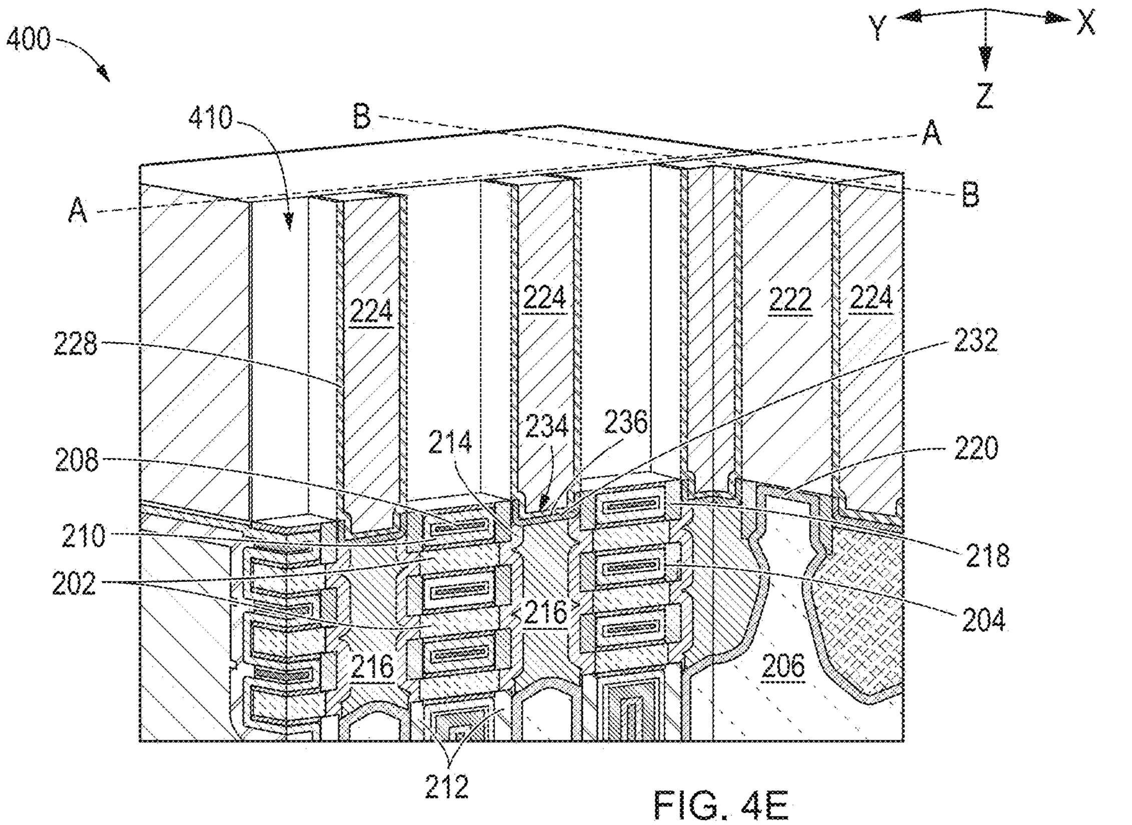
Figure 4E:
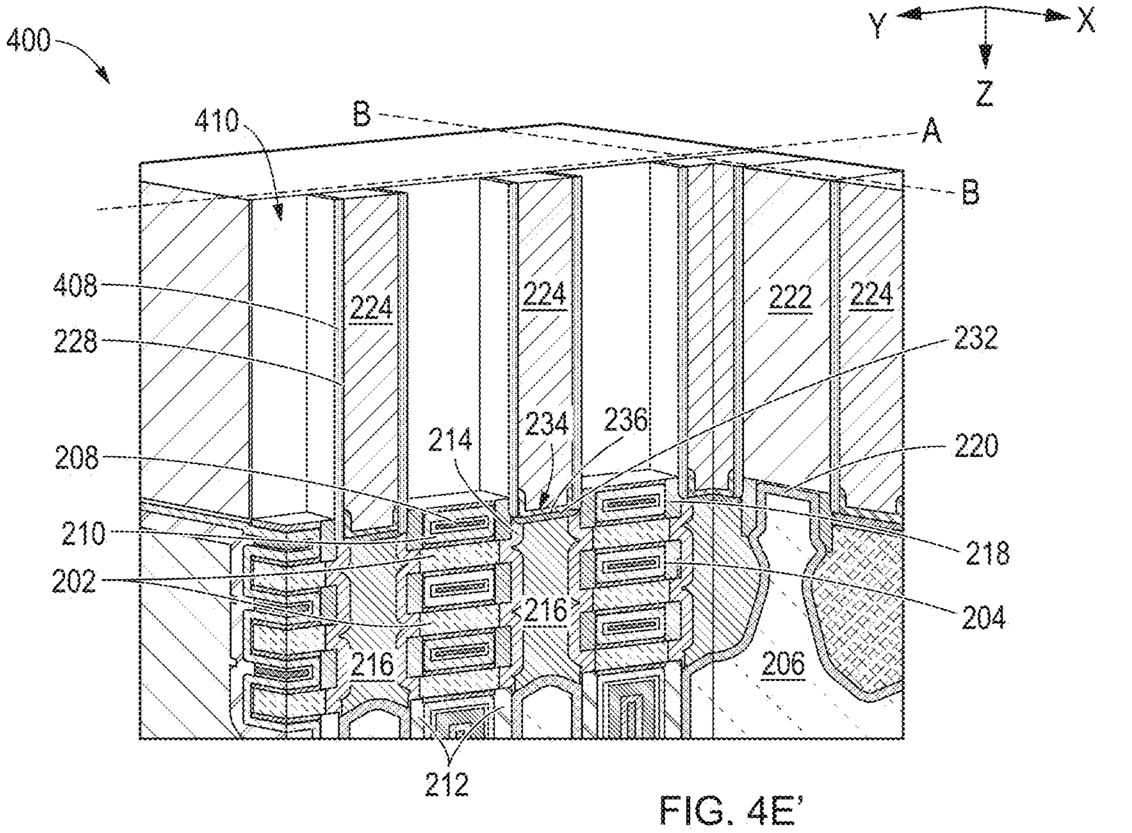

In block 312, a substrate removal process is performed to selectively etch the substrate 406 against the underlying RMG stacks 204 and form ILD recesses 410 between adjacent metal contacts 224, as shown in FIGS. 4E and 4E'.

In FIG. 4E', the nitride layers 408 formed on the sidewalls of the S/D recesses 404 formed in the optional substrate nitridation process in block 306 are shown. The nitride layers 408 may protect the metal contacts 224 during the substrate removal process.

The substrate removal process may include any appropriate wet isotropic etching process, performed in a processing chamber, such as the processing chamber 120 shown in FIG. 1.

Figure 4F:
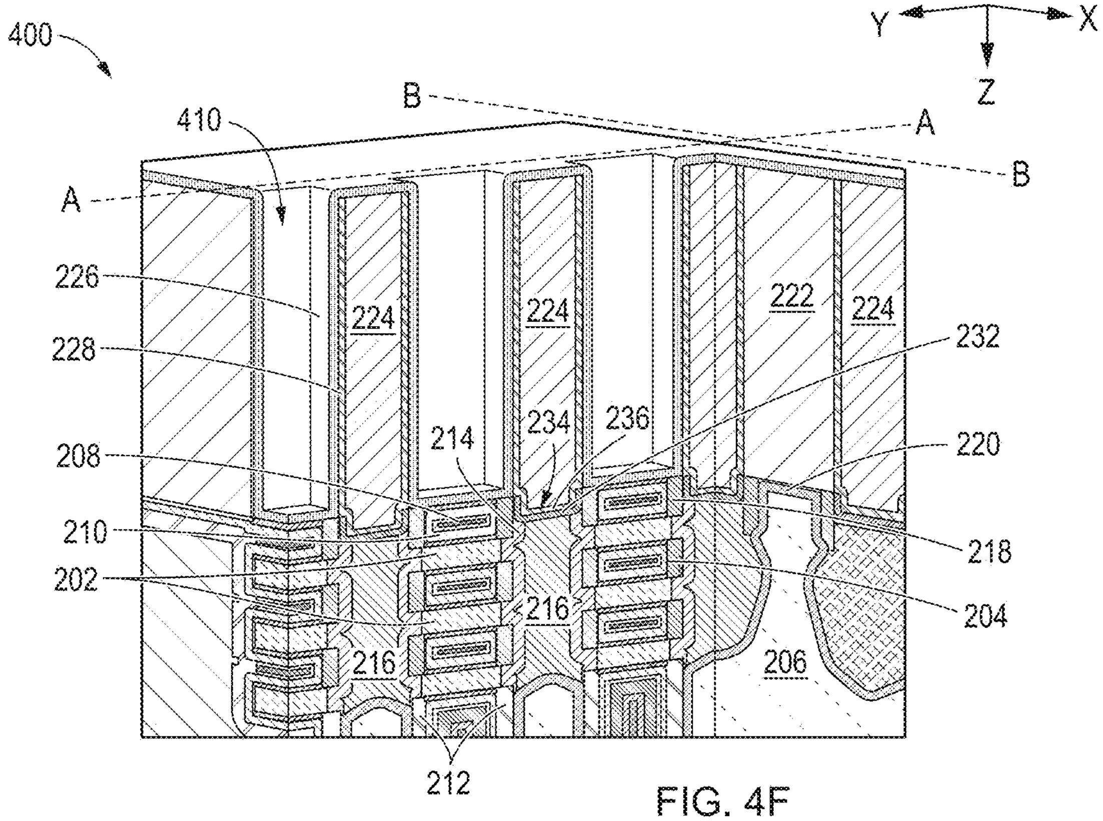

In block 314, a liner deposition process is performed to form a dielectric liner 226 surrounding the metal contacts 224 within the ILD recesses 410, as shown in FIG. 4F. The liner 226 may be formed of silicon nitride ($Si_3N_4$), silicon oxide ($SiO_2$), silicon oxynitride (SiON), aluminum oxide ($Al_2O_3$), silicon oxy-carbon-nitride (SiOCN), or any combination thereof. The liner deposition may include any appropriate deposition process, such as chemical vapor deposition (CVD), or physical vapor deposition (PVD). In the embodiments, where the nitride layers 408 are formed on the sidewalls of the S/D recesses 404, as shown in FIG. 4E', the liner deposition process is optional. The nitride layers 408 can act as a dielectric liner surrounding the metal contacts 2024 within the ILD recesses 410.

Figure 4G:
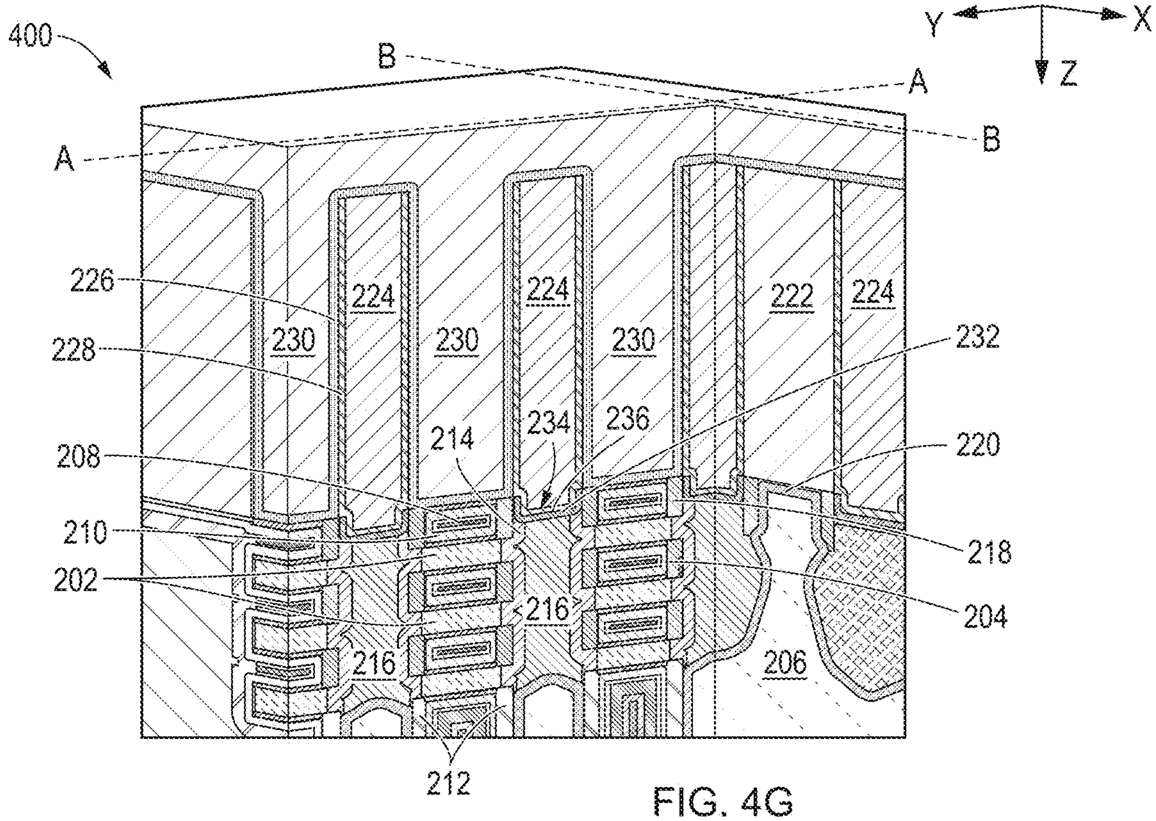

In block 316, an oxide fill process is performed to form the back ILD 230 within the ILD recesses, as shown in FIG. 4G. The conformal deposition may include any appropriate deposition process, such as chemical vapor deposition (CVD), or physical vapor deposition (PVD).

The back ILD 230 may be formed of silicon oxide ($SiO_2$), silicon oxynitride (SiON), aluminum oxide ($Al_2O_3$), silicon oxy-carbon-nitride (SiOCN), or any combination thereof. The oxide fill process may be performed at a low temperature of between about 150° C. and about 400° C.

In block 318, a dielectric CMP process is performed to planarize the semiconductor structure 400 to arrive the semiconductor structure 200, as shown in FIG. 2.

The embodiments described herein provide "isolation last" process flows for forming metal contacts isolated from one another by an inter-layer dielectric (ILD), while protecting source/drain (S/D) epitaxial (epi) layers on a front side of a chip. The methods include etching portions of a chip from a backside of the chip first, and then forming isolation (e.g., inter-layer dielectric (ILD)) at the end of the process flow, such that portions of a chip (e.g., silicon (Si)) can be etched highly selectively to underlying gate metals and high-k materials.

While the foregoing is directed to embodiments of the present disclosure, other and further embodiments of the disclosure may be devised without departing from the basic scope thereof, and the scope thereof is determined by the claims that follow.

The invention claimed is:

1. A method of forming a portion of a gate-all-around field-effect transistor (GAA FET), comprising:

performing a placeholder forming process to form placeholders, each interfacing with an extension region electrically isolated from replacement-metal-gate (RMG) stacks by inner spacers, in recesses formed within portions of a substrate isolated by shallow trench isolations (STIs), the recesses extending into a front inter-layer dielectric (ILD) formed on the substrate;

performing a placeholder removal process to remove the placeholders selectively to the substrate and the STIs;

performing a cavity shaping process to form a cavity at an exposed surface of the extension region within each of the recesses, and a contact formation process to form a contact layer within the cavity;

performing a silicide formation process to form an interface on the contact layer, and a contact metallization process to form a metal contact within each of the recesses;

performing a substrate removal process to selectively etch the substrate against the RMG stacks and form ILD recesses between adjacent metal contacts;

performing a liner deposition process to form a dielectric liner surrounding the metal contacts; and performing an oxide fill process to form a back ILD in each of the ILD recesses.

2. The method of claim 1, wherein:

the placeholders comprise silicon germanium (SiGe), the RMG stacks each comprise a gate metal and a high-k material, the inner spacers comprise silicon nitride ($Si_3N_4$) silicon boron carbon nitride (SiBCN), silicon oxy-carbon-nitride (SiOCN), silicon oxycarbide (SiOC), or organo-silicate glass (SiCOH), the STIs comprise silicon oxide ($SiO_2$), and the front ILD and the back ILD each comprise silicon oxide ($SiO_2$), silicon oxynitride (SiON), aluminum oxide, or ($Al_2O_3$).

3. The method of claim 1, wherein the extension region comprises lightly doped silicon (Si) or silicon germanium (SiGe).

4. The method of claim 1, wherein the contact layer comprises epitaxially grown silicon germanium (SiGe).

5. The method of claim 1, wherein the interface comprises titanium silicide (TiSi, $TiSi_2$), nickel silicide (NiSi, $Ni_2Si$), molybdenum silicide (MoSi, $MoSi_2$), or cobalt silicide ($CoSi_2$), tantalum silicide ($TaSi_2$).

6. The method of claim 1, wherein the metal contacts comprise tungsten (W), ruthenium (Ru), molybdenum (Mo), copper (Cu), cobalt (Co), titanium (Ti), nickel (Ni), silver (Ag), gold (Au), iridium (Ir), tantalum (Ta), platinum (Pt), conductive oxides or nitrides thereof, or any combination thereof.

7. The method of claim 1, wherein the dielectric liner comprises silicon nitride ($Si_3N_4$), silicon oxide ($SiO_2$), silicon oxynitride (SiON), aluminum oxide ($Al_2O_3$), silicon oxy-carbon-nitride (SiOCN).

8. A method of forming a portion of a gate-all-around field-effect transistor (GAA FET), comprising:

performing a placeholder forming process to form placeholders, each interfacing with an extension region electrically isolated from replacement-metal-gate (RMG) stacks by inner spacers, in recesses formed within portions of a substrate isolated by shallow trench isolations (STIs), the recesses extending into a front inter-layer dielectric (ILD) formed on the substrate;

performing a placeholder removal process to remove the placeholders selectively to the substrate and the STIs;

performing a substrate nitridation process to form nitride layers on inner surfaces of the recesses;

performing a cavity shaping process to form a cavity at an exposed surface of the extension region within each of the recesses, and a contact formation process to form a contact layer within the cavity;

performing a silicide formation process to form an interface on the contact layer, and a contact metallization process to form a metal contact within each of the recesses;

performing a substrate removal process to selectively etch the substrate against the RMG stacks and form ILD recesses between adjacent metal contacts;

performing a liner deposition process to form a dielectric liner surrounding the metal contacts; and performing an oxide fill process to form a back ILD in each of the ILD recesses.

9. The method of claim 8, wherein:

the placeholders comprise silicon germanium (SiGe), the RMG stacks each comprise a gate metal and a high-k material, the inner spacers comprise silicon nitride ($Si_3N_4$) silicon boron carbon nitride (SiBCN), silicon oxy-carbon-nitride (SiOCN), silicon oxycarbide (SiOC), or organo-silicate glass (SiCOH), the STIs comprise silicon oxide ($SiO_2$), and the front ILD and the back ILD each comprise silicon oxide ($SiO_2$), silicon oxynitride (SiON), aluminum oxide, or ($Al_2O_3$).

10. The method of claim 8, wherein the extension region comprises lightly doped silicon (Si) or silicon germanium (SiGe).

11. The method of claim 8, wherein the contact layer comprises epitaxially grown silicon germanium (SiGe).

12. The method of claim 8, wherein the interface comprises titanium silicide (TiSi, $TiSi_2$), nickel silicide (NiSi, $Ni_2Si$), molybdenum silicide (MoSi, $MoSi_2$), or cobalt silicide ($CoSi_2$), tantalum silicide ($TaSi_2$).

13. The method of claim 8, wherein the metal contacts comprise tungsten (W), ruthenium (Ru), molybdenum (Mo), copper (Cu), cobalt (Co), titanium (Ti), nickel (Ni), silver (Ag), gold (Au), iridium (Ir), tantalum (Ta), platinum (Pt), conductive oxides or nitrides thereof, or any combination thereof.

14. The method of claim 8, wherein the dielectric liner comprises silicon nitride ($Si_3N_4$), silicon oxide ($SiO_2$), silicon oxynitride (SiON), aluminum oxide ($Al_2O_3$), silicon oxy-carbon-nitride (SiOCN).

15. A method of forming a portion of a gate-all-around field-effect transistor (GAA FET), comprising:

performing a placeholder removal process to remove placeholders formed in recesses within portions of a substrate isolated by shallow trench isolations (STIs), selectively to the substrate and the STIs, wherein:

each of the placeholders interfaces with an extension region electrically isolated from replacement-metal-gate (RMG) stacks by inner spacers, and the recesses extending into a front inter-layer dielectric (ILD) formed on the substrate;

performing a contact formation process to form a contact layer on an exposed surface of the extension region within each of the recesses;

performing a silicide formation process to form an interface on the contact layer, and a contact metallization process to form a metal contact within each of the recesses;

performing a substrate removal process to selectively etch the substrate against the RMG stacks and form ILD recesses between adjacent metal contacts;

performing a liner deposition process to form a dielectric liner surrounding the metal contacts; and performing an oxide fill process to form a back ILD in each of the ILD recesses.

16. The method of claim 15, wherein:

the placeholders comprise silicon germanium (SiGe), the RMG stacks each comprise a gate metal and a high-k material, the inner spacers comprise silicon nitride ($Si_3N_4$) silicon boron carbon nitride (SiBCN), silicon oxy-carbon-nitride (SiOCN), silicon oxycarbide (SiOC), or organo-silicate glass (SiCOH), the STIs comprise silicon oxide ($SiO_2$), and the front ILD and the back ILD each comprise silicon oxide ($SiO_2$), silicon oxynitride (SiON), aluminum oxide, or ($Al_2O_3$).

17. The method of claim 15, wherein the extension region comprises lightly doped silicon (Si) or silicon germanium (SiGe), and the contact layer comprises epitaxially grown silicon germanium (SiGe).

18. The method of claim 15, wherein the interface comprises titanium silicide (TiSi, $TiSi_2$), nickel silicide (NiSi, $Ni_2Si$), molybdenum silicide (MoSi, $MoSi_2$), or cobalt silicide ($CoSi_2$), tantalum silicide ($TaSi_2$).

19. The method of claim 15, wherein the metal contacts comprise tungsten (W), ruthenium (Ru), molybdenum (Mo), copper (Cu), cobalt (Co), titanium (Ti), nickel (Ni), silver (Ag), gold (Au), iridium (Ir), tantalum (Ta), platinum (Pt), conductive oxides or nitrides thereof, or any combination thereof.

20. The method of claim 15, wherein the dielectric liner comprises silicon nitride ($Si_3N_4$), silicon oxide ($SiO_2$), silicon oxynitride (SiON), aluminum oxide ($Al_2O_3$), silicon oxy-carbon-nitride (SiOCN).

* * * * *